US012710462B2

(12) United States Patent
Knareekunnan et al.

(10) Patent No.: US 12,710,462 B2
(45) Date of Patent: Aug. 18, 2026

(54) SENSOR DEVICE CAPABLE OF MEASURING ELECTRIC FIELD STRENGTH OF AN EXTERNAL ELECTRIC FIELD AND METHOD FOR MEASURING EXTERNAL ELECTRIC FIELD

(71) Applicant: OTOWA ELECTRIC CO., LTD., Osaka (JP)

(72) Inventors: Afsal Knareekunnan, Nomi (JP); Hiroshi Mizuta, Nomi (JP); Manoharan Muruganathan, Nomi (JP); Takeshi Kudo, Amagasaki (JP); Takeshi Maruyama, Amagasaki (JP)

(73) Assignee: OTOWA ELECTRIC CO., LTD., Osaka (JP)

( * ) Notice: Subject to any disclaimer, the term of this patent is extended or adjusted under 35 U.S.C. 154(b) by 81 days.

(21) Appl. No.: 18/689,957

(22) PCT Filed: Sep. 5, 2022

(86) PCT No.: PCT/JP2022/033318
§ 371 (c)(1),
(2) Date: Mar. 7, 2024

(87) PCT Pub. No.: WO2023/038015
PCT Pub. Date: Mar. 16, 2023

(65) Prior Publication Data

US 2024/0295596 A1 Sep. 5, 2024

(30) Foreign Application Priority Data

Sep. 8, 2021 (JP) ................................ 2021-146438

(51) Int. Cl.
*G01R 29/12* (2006.01)
*G01R 5/28* (2006.01)
(Continued)

(52) U.S. Cl.
CPC ............... *G01R 29/12* (2013.01); *G01R 5/28* (2013.01); *G01R 29/0878* (2013.01);
(Continued)

(58) Field of Classification Search
CPC .... G01R 29/12; G01R 29/0878; G01R 29/14; G01R 5/28; H10D 30/67; H10D 62/882; G01W 1/16
(Continued)

(56) References Cited

U.S. PATENT DOCUMENTS

2009/0072835 A1* 3/2009 Dorwarth ................ D06F 34/22
324/448
2009/0146668 A1* 6/2009 Wuerstlein ........... B06N 2/0244
324/663
(Continued)

FOREIGN PATENT DOCUMENTS

CN 107490730 A 12/2017
CN 109860287 B 3/2021
(Continued)

OTHER PUBLICATIONS

CN 107490730 Machine Translation, Dec. 19, 2017 (Year: 2017).*
(Continued)

*Primary Examiner* — Raul J Rios Russo
(74) *Attorney, Agent, or Firm* — Myers Wolin, LLC

(57) ABSTRACT

A sensor device capable of measuring electric field strength of an external electric field includes a first dielectric layer, a first atomic layer material film disposed on the first dielectric layer and including one or more atomic layers formed of a first material, a channel layer disposed on the first atomic layer material film, including a channel region, and including one or more atomic layers of graphene, a second atomic layer material film disposed on the channel layer and including one or more atomic layers formed of a second material,
(Continued)

and a first electrode and second electrode disposed on the channel layer across the channel region in a manner facing each other, wherein the second atomic layer material film includes a first side and a second side, the first side being disposed on the channel layer and the portion of the second side opposite from the channel region being exposed to the outside, or a second dielectric layer being disposed on the second side and the portion on the side opposite from the channel region of the side of the second dielectric layer opposite from the second atomic layer material film being exposed to the outside.

7 Claims, 8 Drawing Sheets

(51) Int. Cl.
*G01R 29/08* (2006.01)
*G01R 29/14* (2006.01)
*G01W 1/16* (2006.01)
*H10D 30/67* (2025.01)
*H10D 62/80* (2025.01)

(52) U.S. Cl.
CPC ............... *G01R 29/14* (2013.01); *G01W 1/16* (2013.01); *H10D 30/67* (2025.01); *H10D 62/882* (2025.01)

(58) Field of Classification Search
USPC .......................................................... 324/457
See application file for complete search history.

(56) References Cited

U.S. PATENT DOCUMENTS

2009/0146827 A1* 6/2009 Wuerstlein ........... H03K 17/955 340/657
2012/0182016 A1* 7/2012 Ahler ....................... G01V 3/15 324/348
2013/0009647 A1* 1/2013 Miyazawa ............. G01R 29/12 324/457
2014/0152319 A1* 6/2014 Dawson ............... A61B 5/6831 324/457
2015/0288361 A1* 10/2015 Kaltner ................ H03K 17/955 324/671
2020/0408569 A1* 12/2020 Bonemberg ......... H03K 17/955
2023/0058373 A1* 2/2023 Debiemme-Chouvy .................... G01N 17/02

FOREIGN PATENT DOCUMENTS

CN 116047180 A 5/2023
JP H04-10549 A 1/1992
JP 2014-522321 A 9/2014
JP 2017-163042 A 9/2017
JP 2020-46213 A 3/2020
JP 2022-73270 A 5/2022
WO 2012/127245 A2 9/2012

OTHER PUBLICATIONS

International Search Report issued by the Japan Patent Office for corresponding International Patent Application No. PCT/JP2022/033318, mailed on Oct. 11, 2022. English translation only.
Wang et al., “High Performance Graphene-Based Electrostatic Field Sensor”, IEEE Electron Device Letters, Aug. 2017, pp. 1136-1138, vol. 38, No. 8.
Kareekunnan Afsal et al., “Enhancement of Electric Field Sensitivity in Graphene for Early Lightning Prediction”, IEEE Xplore, 2021 Silicon Nanoelectronics Workshop, Jun. 2021 [downloaded on Sep. 2022].
Xu et al., “Substrate Engineering by Hexagonal Boron Nitride/SiO2 for Hysteresis-Free Graphene FETs and Large-Scale Graphene p—n Junctions”, Chemistry—An Asian Journal, Oct. 2013, pp. 2446-2452, vol. 8.
Mark N. Horenstein, “A Direct Gate Field-Effect Transistor for the Measurement of DC Electric Fields”, IEEE Transactions on Electron Devices, Mar. 1985, pp. 716-717, vol. ED-32, No. 3.
The Extended European search report with the Supplementary European search report and the European search opinion, issued by the European Patent Office for European Patent Application No. 22867337.2, mailed on Aug. 19, 2025.

* cited by examiner

SENSOR DEVICE CAPABLE OF MEASURING ELECTRIC FIELD STRENGTH OF AN EXTERNAL ELECTRIC FIELD AND METHOD FOR MEASURING EXTERNAL ELECTRIC FIELD

CROSS-REFERENCE TO RELATED APPLICATION

This application is a National Phase under 35 U.S.C. 371 of PCT/JP2022/033318, filed on Sep. 5, 2022, and which designated the U.S., which claims priority to Japanese Patent Application No. 2021-146438, filed on Sep. 8, 2021. The contents of each are wholly incorporated herein by reference.

FIELD

The present disclosure relates to a sensor device capable of measuring electric field strength of an external electric field and a method for measuring an external electric field.

BACKGROUND

Sensor devices have been used for measurement of electric field strength in air. Measurement of electric field strength in air allows monitoring of developing and approaching thunderclouds (see PTL 1, for example).

Sensor devices are also used to measure electric field strength in indoor atmospheres. Measurement of electric field strength allows monitoring of the condition of indoor static electricity to help prevent accidents caused by static electricity.

Sensor devices used to measure electric field strength include mechanical sensor devices and semiconductor sensor devices. Mechanical sensor devices have relatively large dimensions and heavy weights (PTL 1, for example). Semiconductor sensor devices have relatively smaller dimensions and lighter weights (NPL 1, for example).

A mechanical sensor device has electrodes with charge induced by application of an external electric field, a rotating plate having an opening that allows the electrodes to be exposed to the outside, and a driving unit that drives rotation of the rotating plate. In such a mechanical sensor device, rotation of the rotating plate causes the electrode to be exposed to the outside while repeatedly covering it by the rotating plate, thereby intermittently applying an electrostatic field to the electrode so that the electric field strength of the external electric field is measured as an AC signal generated in the electrode.

A semiconductor sensor device has a transistor disposed on a substrate. The electric field strength of an external electric field applied to the substrate is measured as the amount of the current flowing between the source electrode and drain electrode when the transistor is in the ON state.

CITATION LIST

Patent Literature

[PTL 1]

Japanese Unexamined Patent Publication No. 2020-46213

Non Patent Literature

NPL 1 Wang et al., High-performance graphene-based electrostatic field sensor, IEEE ELECTRON DEVICE LETTERS, Vol 38, No. 8, August 2017

SUMMARY

Technical Problem

Because of their large dimensions and heavy weights, mechanical sensor devices such as described above cannot be fitted into narrow spaces. Semiconductor sensor devices, having smaller dimensions and lighter weights, can be fitted into narrow spaces, but have the problem of having a high lower limit for the field strength that can be measured.

Proposed herein is a sensor device that has small dimensions while also being capable of measuring low field strengths.

Solution to Problem

One embodiment of the sensor device disclosed herein is a sensor device capable of measuring the electric field strength of an external electric field, the sensor device having a first dielectric layer, a first atomic layer material film disposed on the first dielectric layer and having one or more atomic layers formed of a first material, a channel layer disposed on the first atomic layer material film, having a channel region, and having one or more atomic layers of graphene, a second atomic layer material film disposed on the channel layer and having one or more atomic layers formed of a second material, and a first electrode and second electrode disposed on the channel layer across the channel region in a manner facing each other, wherein the second atomic layer material film has a first side and a second side, the first side being disposed on the channel layer and the portion of the second side opposite from the channel region being exposed to the outside, or a second dielectric layer being disposed on the second side and the portion on the side opposite from the channel region of the side of the second dielectric layer opposite from the second atomic layer material film being exposed to the outside, or the second dielectric layer being disposed on the second side.

According to one embodiment of the method for measuring an external electric field disclosed herein, the sensor device described above is used for measurement of an external electric field. The method is characterized by measuring the current value flowing between the first electrode and second electrode while the external electric field is applied to the sensor device, and determining the electric field strength of the external electric field based on the current value.

Advantageous Effects

The sensor device disclosed herein has small dimensions and allows measurement of small electric field strengths.

The method for measuring an external electric field disclosed herein allows measurement of small electric field strengths using the sensor device with small dimensions.

DESCRIPTION OF EMBODIMENTS

A first preferred embodiment of the sensor device disclosed herein will now be described with reference to the accompanying drawings. The technical scope of the disclosure is not limited to this embodiment, however, and includes the disclosure and its equivalents as laid out in the claims.

Figure 1A:
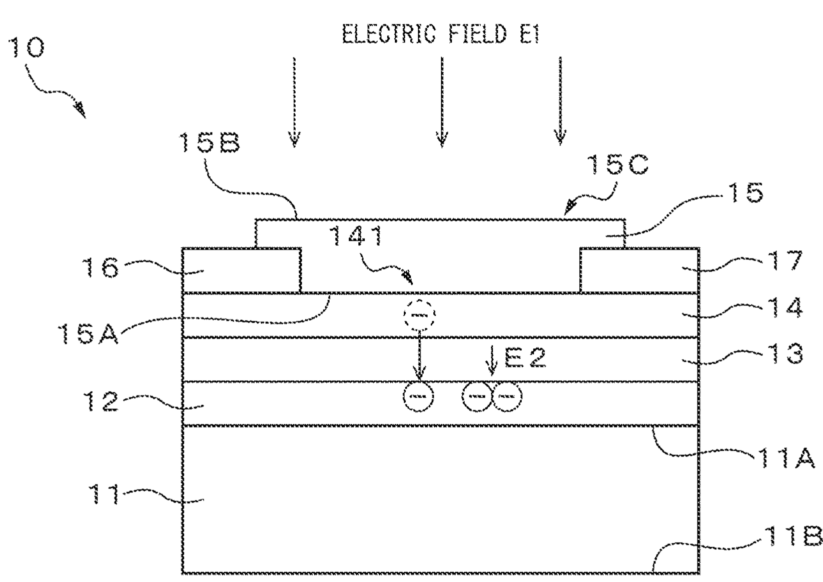
FIG. 1(A) is a cross-sectional view of a first embodiment of the sensor device disclosed herein, and FIG. 1 (B) is a plan view of the same.
Figure 1B:
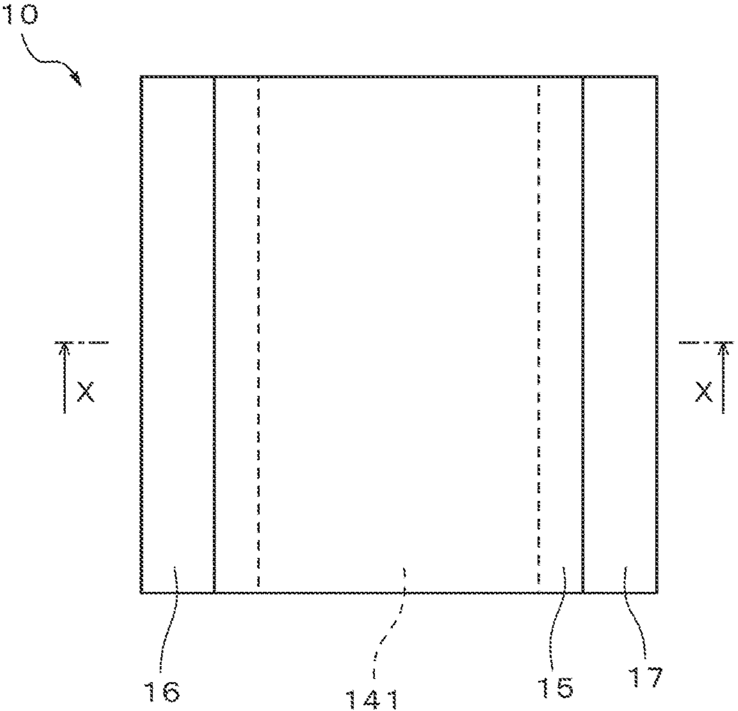

FIG. 1(A) shows a first embodiment of the sensor device disclosed herein, being a cross-sectional view of FIG. 1(B) along line X-X, and FIG. 1(B) is a plan view of the same. FIG. 1(A) shows a state where a (positive) external electric field is applied to a sensor device in the direction from the outside toward the sensor device.

The sensor device 10 of this embodiment allows measurement of the strength of an external electric field E1 applied from the outside. The external electric field E1 is an electric field produced from a generation source located outside of the sensor device 10. The sensor device 10 has high sensitivity and therefore allows measurement of a small electric field strength.

The sensor device 10 has a substrate 11, a dielectric layer 12, a first atomic layer material film 13, a channel layer 14, a second atomic layer material film 15, a source electrode 16 and a drain electrode 17. As explained in detail below, the sensor device 10 has high sensitivity because the channel layer 14 is formed using a single layer or multiple layers of graphene, and thus allows measurement of a small external electric field E1. The sensor device 10 of the embodiment is able to measure the strength of an external electric field E1 as current, since it acts as an ambipolar transistor when an external electric field is applied.

The substrate 11 has sufficient mechanical strength to support the other constituent elements of the sensor device 10, has a first side 11A and a second side 11B, and may be a semiconductor substrate such as a silicon, silicon carbide or compound semiconductor substrate. A semiconductor substrate used as a substrate may be amorphous, polycrystalline or single crystal. The substrate 11 may have either p-type polarity or n-type polarity, and may also be intrinsic without addition of impurities. If the dielectric layer 12 has sufficient mechanical strength to support the other constituent elements of the sensor device 10, then the sensor device 10 does not need to have a substrate 11.

The dielectric layer 12 has electrical insulating properties, is disposed on the first side 11A of the substrate 11, and electrically insulates the substrate 11 and the first atomic layer material film 13.

The dielectric layer 12 used may be a dielectric material such as silicon dioxide, aluminum oxide or silicon nitride. When the substrate 11 is a silicon substrate, using silicon dioxide as the dielectric layer 12 is preferred for production of the sensor device 10.

The first atomic layer material film 13 is disposed on the dielectric layer 12. The first atomic layer material film 13 is formed of a material that can form a monoatomic layer, and has one or more atomic layers formed of the material. Examples of the material include hexagonal boron nitride, hexagonal molybdenum disulfide and hexagonal tungsten disulfide.

The first atomic layer material film 13 has a lattice mismatch degree of preferably 10% or lower and especially 5% or lower, with the graphene forming the channel layer 14. The lattice mismatch degree is the absolute value of the difference between the lattice constant of the first atomic layer material film 13 and the lattice constant of graphene (when the first atomic layer material film 13 is disposed on the channel layer 14 in a manner for maximal matching between the lattice constant of the first atomic layer material film 13 and the lattice constant of graphene), divided by the lattice constant of graphene and represented as a percentage. For example, when the first atomic layer material film 13 is formed of boron nitride, the unit lattices of the respective monoatomic layers of graphene and boron nitride each have an a-axis and a b-axis extending within a two-dimensional plane, and a c-axis perpendicular to the a-axis and b-axis. If the first atomic layer material film 13 is disposed on the channel layer 14 so that the c-axes of graphene and boron nitride are aligned and the a-axis and c-axis are rotated to maximal matching between the lattice constants of the monoatomic layers of graphene and boron nitride, the lattice mismatch degree is 1.71%, assuming the first atomic layer material film 13 is formed of boron nitride. When the first atomic layer material film 13 is formed of molybdenum disulfide, the lattice mismatch degree is 3.01%, and when the first atomic layer material film 13 is formed of tungsten disulfide, the lattice mismatch degree is 3.26%.

The surface of the dielectric layer 12 formed of silicon dioxide will usually be concavoconvex instead of flat. The surface of the dielectric layer 12 will also often include impurities. When the channel layer 14 is disposed directly on the surface of the dielectric layer 12, such a condition of the surface of the dielectric layer 12 creates distortion in the two-dimensional periodic structure of graphene forming the channel layer 14, and also produces electrical effects due to impurities. This causes the carrier moving within the graphene to be scattered by the distortion or impurities, thus reducing the carrier mobility. For this embodiment, therefore, having the first atomic layer material film 13 disposed on the surface of the dielectric layer 12 and the channel layer 14 disposed on the first atomic layer material film 13 inhibits the reduction in the carrier mobility in the graphene due to the effect of the dielectric layer 12.

Since the first atomic layer material film 13 has a small lattice mismatch degree with the graphene forming the channel layer 14, distortion in the two-dimensional periodic structure of the graphene forming the channel layer 14 is inhibited, even if the channel layer 14 is directly disposed on the first atomic layer material film 13.

The thickness of the first atomic layer material film 13 is preferably in the range of 1 to 120 atomic layers. If the thickness of the first atomic layer material film 13 is 1 atomic layer or greater, the effect of the dielectric layer 12 on the carrier mobility in the graphene can be reduced.

A greater thickness of the first atomic layer material film 13 will result in less change in drain current flowing between the source electrode 16 and drain electrode 17 when the external electric field E1 has been applied to the sensor device 10. The thickness of the first atomic layer material film 13 is preferably determined according to the range of the external electric field E1 to be measured. If the thickness of the first atomic layer material film 13 is too large with respect to the strength of the external electric field E1, it may not be possible to accurately measure a small external electric field E1. As explained in detail below, a thickness of the first atomic layer material film 13 of 120 atomic layers allows measurement up to external electric field E1 strength of about 17 kV/m. Since the electric field strength near the ground surface directly under a thundercloud is generally about several kV/m to 10 kV/m, from the viewpoint of accurately measuring external electric field strength by common thunderclouds, therefore, the thickness of the first atomic layer material film 13 is preferably in the range of 1 to 40 atomic layers in order to obtain large change in drain current.

The channel layer 14 has a channel region 141 and one or more atomic layers of graphene. The channel region 141 of the channel layer 14 is preferably disposed on at least the first atomic layer material film 13. For this embodiment, the entire channel layer 14 is disposed on the first atomic layer material film 13. The channel layer 14 may have either p-type polarity or n-type polarity. The channel layer 14 may also be pure without addition of impurities.

A higher sensitivity (gain) of the sensor device 10 increases the lower measurable limit for electric field strength. Since the channel layer 14 in the sensor device 10 is formed using one or more atomic layers of graphene, it has high sensitivity.

The channel layer 14 is formed using one or more atomic layers of graphene from the viewpoint of improving the sensitivity of the sensor device 10. Graphene has high carrier mobility. A monoatomic layer of graphene has carrier mobility of $2\times10^5$ ($cm^2V^{-1}S^{-1}$). This carrier mobility is more than two orders of magnitude higher than the electron mobility of $1.4\times10^3$ ($cm^2V^{-1}S^{-1}$) for a crystalline silicon substrate. From the viewpoint of obtaining high carrier mobility, the channel layer 14 is preferably formed using 1 to 10 atomic layers and especially 1 to 4 atomic layers of graphene. The channel layer 14 has highest carrier mobility when formed using a monoatomic layer of graphene.

The carrier mobility of the channel layer 14 is reduced by more than 20% with each 1 nm increase in thickness. The channel layer 14 has moderate reduction in mobility when exceeding 13 atomic layers of graphene, but exhibits relatively high mobility up to about 10 layers.

The second atomic layer material film 15 has electrical insulating properties and is disposed on the channel layer 14. The second atomic layer material film 15 protects the channel layer 14. The second atomic layer material film 15 has a first side 15A and a second side 15B, the first side 15A being disposed on the channel layer 14 and the second side 15B being exposed to the outside. The external electric field E1 enters the sensor device 10 through the second side 15B.

The second side 15B of the second atomic layer material film 15 forms an input/output region 15C. At least the portion of the second side 15B opposite from the channel region 141 is exposed to the outside. This allows the external electric field E1 to be input into the sensor device 10 through the input/output region 15C. The external electric field E1 can also be output from the sensor device 10 through the input/output region 15C.

The second atomic layer material film 15 is formed of a material that can form a monoatomic layer, and has one or more atomic layers formed of the material. Examples for the material include hexagonal boron nitride, molybdenum disulfide and tungsten disulfide. The second atomic layer material film 15 has a lattice mismatch degree of preferably 10% or lower and especially 5% or lower, with the graphene forming the channel layer 14. The explanation for the first atomic layer material film 13 provided above similarly applies in regard to the lattice mismatch degree of the second atomic layer material film 15.

The second atomic layer material film 15 is directly disposed on the channel layer 14, but a large lattice mismatch degree between the material forming the second atomic layer material film 15 and the graphene forming the channel layer 14 results in distortion in the two-dimensional periodic structure of the graphene forming the channel layer 14. This causes the carrier moving within the graphene to be scattered, thus reducing the carrier mobility. For this embodiment, therefore, if the second atomic layer material film 15 having a small lattice mismatch degree with the graphene forming the channel layer 14 is disposed on the channel layer 14, then reduction in the carrier mobility in the graphene due to the effect of the second atomic layer material film 15 will be inhibited.

The thickness of the second atomic layer material film 15 is preferably in the range of 1 to 100 atomic layers. A thickness of the second atomic layer material film 15 of one or more atomic layers can physically protect the channel layer 14. From the viewpoint of preventing doping of the channel layer 14 by the resist or water during production of the sensor device 10, the thickness of the second atomic layer material film 15 is most preferably in the range of 60 to 90 atomic layers. Action of the external electric field E1 on the channel layer 14 will be explained in detail below.

The source electrode 16 and drain electrode 17 are disposed on the channel layer 14 across the channel region 141 of the channel layer 14 in a manner facing each other. It is sufficient if at least portions of the source electrode 16 and drain electrode 17 pair are disposed on the channel layer 14. For this embodiment, the entirety of the source electrode 16 and drain electrode 17 are disposed on the channel layer 14.

The sensor device 10 acts as an ambipolar transistor. When an external electric field E1 (gate voltage) is applied to the channel region 141, the sensor device 10 has increased drain current flowing between the source electrode 16 and drain electrode 17.

Figures 2A, 2B:
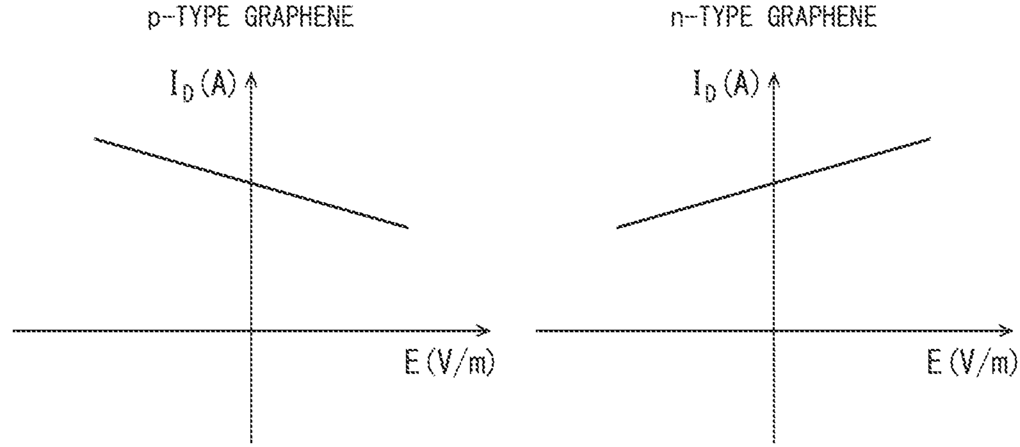
FIG. 2(A) is a diagram showing the relationship between drain current and external electric field strength applied to a sensor device having a p-type graphene channel layer, and FIG. 2 (B) is a diagram showing the relationship between drain current and external electric field strength applied to a sensor device having an n-type graphene channel layer.

FIG. 2(A) is a diagram showing the relationship between drain current with respect to strength of an external electric field applied to a sensor device having a p-type graphene channel layer. FIG. 2(B) is a diagram showing the relationship between drain current with respect to strength of an external electric field applied to a sensor device having an n-type graphene channel layer.

When the channel layer 14 is formed using p-type graphene, the drain current $I_D$ decreases as the strength of the positive external electric field E increases, as shown in FIG. 2(A). Drain current normally flows through an ambipolar transistor even without application of an external electric field E (gate voltage=0). When the channel layer 14 is formed using p-type graphene, on the other hand, the drain current $I_D$ increases as the strength of the negative external electric field E increases. The electric lines of force of the negative external electric field E run in the direction from the substrate 11 toward the second atomic layer material film 15. When the channel layer 14 is formed using n-type graphene, the drain current $I_D$ increases as the strength of the positive external electric field E increases, as shown in FIG. 2(B). When the channel layer 14 is formed using n-type graphene, on the other hand, the drain current $I_D$ decreases as the strength of the negative external electric field E1 increases.

Operation of a sensor device 10 with application of an external electric field E1, which measures the strength of the external electric field E1 as change in drain current value, will now be described with reference to FIG. 1(A) to FIG. 3.

In FIG. 1(A), an external electric field E1 is applied to the sensor device 10 in the direction from the outside toward the sensor device 10 (positive direction). The electric lines of force of the positive external electric field E1 run in the direction from the second atomic layer material film 15 toward the substrate 11.

The external electric field E1 enters the sensor device 10 from the input/output region 15C, and exits outward through the second side 11B of the substrate 11. Since the sensor device 10 uses the second side 15B of the second atomic layer material film 15, which is one of the constituent elements, as the input/output region 15C for the external electric field E1, it is able to measure the external electric field E1 even with small dimensions.

The external electric field E1 applied to the sensor device 10 causes electrons in the channel layer 14 to pass through the first atomic layer material film 13 by tunneling, and move into the dielectric layer 12. The number of electrons passing through the first atomic layer material film 13 by the external electric field E1 depends on the strength of the external electric field E1. A smaller thickness is therefore preferred for the first atomic layer material film 13.

A larger area of the channel region 141 of the channel layer 14 will result in more electrons moving into the dielectric layer 12.

A larger area of the input/output region 15C will also increase the number of electrons moving into the dielectric layer 12.

Electrons that have moved into the dielectric layer 12 are trapped by defects at the interface with the first atomic layer material film 13 of the dielectric layer 12. The electrons trapped at the interface generate an internal electric field E2 in the sensor device 10. Action of the internal electric field E2 on the channel layer 14 alters the Fermi level of the channel layer 14. When the Fermi level of the channel layer 14 is altered, the amount of the drain current flowing to the channel region 141 between the source electrode 16 and drain electrode 17 changes. When the channel layer 14 is formed of p-type graphene, the Fermi level increases. When the channel layer 14 is formed of n-type graphene, on the other hand, the Fermi level decreases. An increasing Fermi level reduces the drain current, while a decreasing Fermi level increases the drain current. The strength of the external electric field E1 can be measured based on the degree of change in the drain current value with respect to the drain current value without application of the external electric field E1 to the sensor device 10. A larger number of carriers trapped at defects at the interface between the dielectric layer 12 and first atomic layer material film 13 increases the gain of the sensor device 10.

Figure 3:
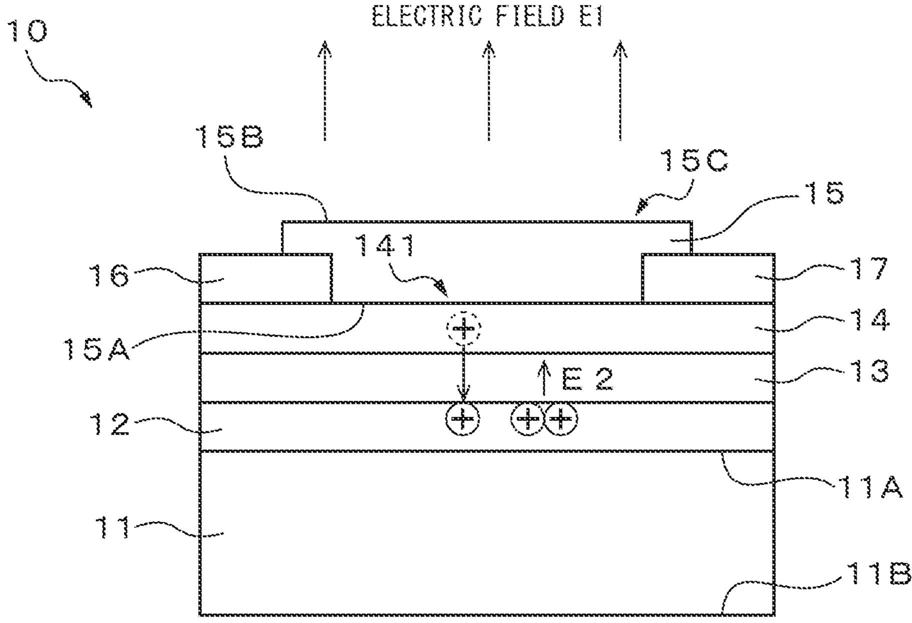
FIG. 3 is a diagram showing a state where an external electric field is applied to a sensor device in the outward direction from the sensor device (negative direction).

In FIG. 3, an external electric field E1 is applied to the sensor device 10 in the direction from the sensor device 10 toward the outside (negative direction). The electric lines of force of the negative external electric field E1 run in the direction from the substrate 11 toward the second atomic layer material film 15.

The external electric field E1 enters the sensor device 10 from the second side 11B of the substrate 11, and exits outward through the input/output region 15C.

The external electric field E1 applied to the sensor device 10 causes holes in the channel layer 14 to pass through the first atomic layer material film 13 by tunneling, and move into the dielectric layer 12. The number of holes passing through the first atomic layer material film 13 by the external electric field E1 depends on the strength of the external electric field E1.

Holes that have moved into the dielectric layer 12 are trapped by defects at the interface between the dielectric layer 12 and the first atomic layer material film 13. The holes trapped at the interface generate an internal electric field E2 in the sensor device 10. Action of the internal electric field E2 on the channel layer 14 alters the Fermi level of the channel layer 14. When the Fermi level of the channel layer 14 is altered, the amount of the drain current flowing between the source electrode 16 and drain electrode 17 changes. The strength of the external electric field E1 can be measured based on the degree of change in the drain current value with respect to the drain current value without application of the external electric field E1 to the sensor device 10.

The sensor device 10 must exhibit required performance including such high sensitivity, as well as a wide measuring range. A wider measuring range for the sensor device 10 provides a wider range of measurable electric field strengths.

The maximum number of carriers induced at the interface between the dielectric layer 12 and the first atomic layer material film 13 upon application of an external electric field will be greater with a smaller thickness of the first atomic layer material film 13. The number of carriers trapped at defects at the interface with the dielectric layer 12 increases with increasing strength of the external electric field E1, eventually becoming saturated. The difference between the number of carriers at the interface with the dielectric layer 12 in the absence of an external electric field and the number of carriers trapped at defects at the interface upon saturation corresponds to the measuring range of the sensor device 10.

An example of measurement of an external electric field E1 using the sensor device 10 will now be described.

Figure 4:
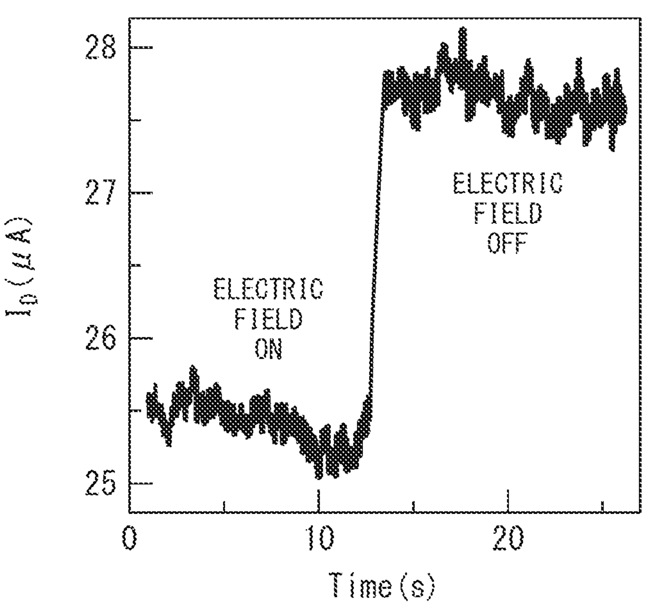
FIG. 4 is a graph showing the relationship between drain current and time when a positive external electric field is applied to a sensor device.

FIG. 4 is a graph showing the relationship between drain current and time when a positive external electric field E1 is applied to the sensor device 10. The ordinate in FIG. 4 represents drain current, and the abscissa represents time. The relationship shown in FIG. 4 was measured using parallel plates disposed on either side of the sensor device 10 with a spacing of 3 cm, and application of 500 V between the parallel plates (external electric field strength: ~16,667 V/m). The first atomic layer material film 13 was formed using hexagonal boron nitride. A voltage of 100 mV was applied between the source electrode 16 and drain electrode 17. The drain current value with application of a positive external electric field E1 to the sensor device 10 is lower than without application of the external electric field E1 to the sensor device 10.

Figure 5:
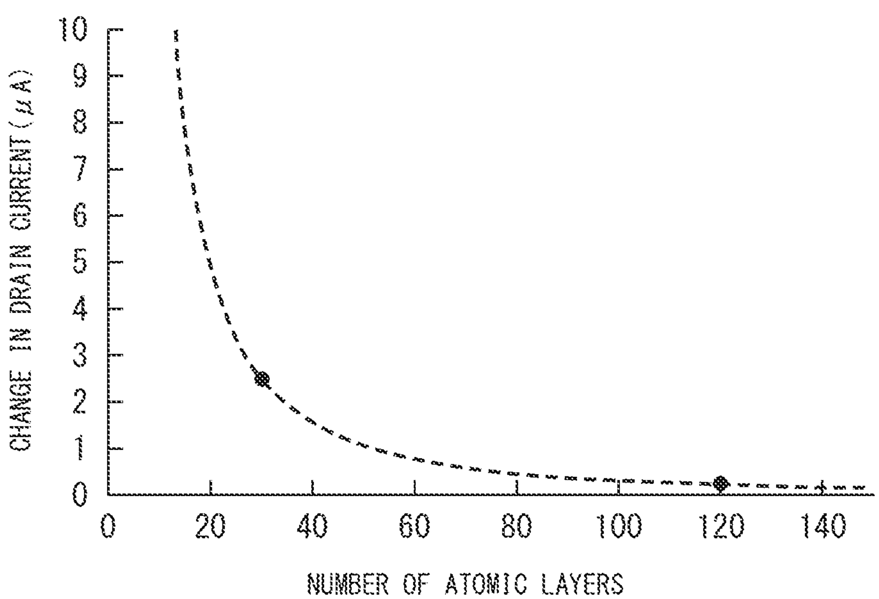
FIG. 5 is a graph showing the relationship between number of atomic layers of a first atomic layer material film and change in drain current.

FIG. 5 is a graph showing the relationship between number of atomic layers in the first atomic layer material film 13 and change in drain current. FIG. 5 shows the results of measuring change in drain current with different numbers of atomic layers of the first atomic layer material film 13 used for the measurement shown in FIG. 4. The change in drain current decreases in an exponential manner as the number of atomic layers of the first atomic layer material film 13 increases. From the viewpoint of using the sensor device 10 for measurement of change in drain current, 120 layers is the upper limit for the number of atomic layers of the first atomic layer material film 13. The lower limit for change in drain current may be about 1.5 μA from the viewpoint of accurately measuring change in drain current using the sensor device 10. In this case the upper limit for the number of atomic layers of the first atomic layer material film 13 is 40 layers. If the goal is accurate measurement of electric field strength, the first atomic layer material film 13 preferably has 1 to 40 atomic layers, and if the goal is measurement of the electric field strength in a wide measuring range, the first atomic layer material film 13 preferably has 1 to 120 atomic layers.

The sensor device 10 of the embodiment has small dimensions and allows measurement of small electric field strengths. By changing the number of atomic layers of the first atomic layer material film 13, the sensor device is also able to accurately measure electric field strengths and to measure electric field strengths in a wide measuring range.

The sensor device 10 further provides the following advantages compared to mechanical sensor devices of the related art. A mechanical sensor device, having dimensions of several tens of cm and a weight of several kg, is restricted in terms of where it can be installed. However, the dimensions of the present sensor device 10 are at most several cm, with a maximum weight of a few grams, even when modularized to provide suitable measuring function, and therefore the sensor device 10 has much more moderate restrictions on possible installation locations. Moreover a mechanical sensor device, which has a driving unit, is prone to malfunction and requires maintenance. The sensor device 10, however, being a semiconductor sensor, has a greatly reduced chance of malfunction. A mechanical sensor device also has high power consumption and requires a power supply device such as an AC power source. The sensor device 10, on the other hand, has low power consumption and can therefore run on a simple power supply device such as a battery.

Another embodiment of the aforementioned sensor device will now be described with reference to FIG. 6 and FIG. 7. The detailed explanation provided for the first embodiment applies for any aspects of this additional embodiment that are not explained here. The same reference numerals are also used for corresponding constituent elements.

Figure 6:
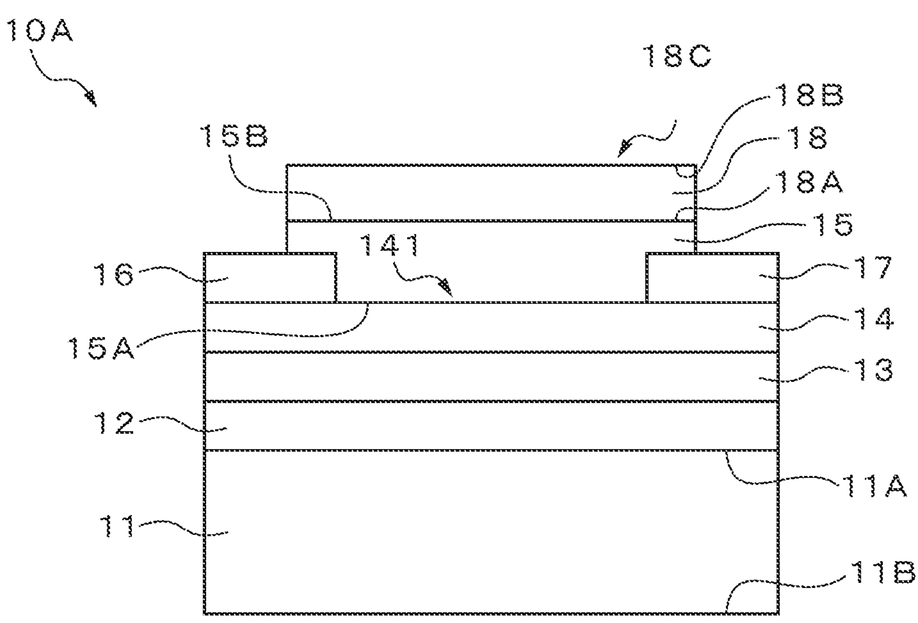
FIG. 6 is a cross-sectional view showing a second embodiment of the sensor device disclosed herein.

FIG. 6 is a cross-sectional view showing a second embodiment of the sensor device 10A disclosed herein. A second dielectric layer 18 is disposed on the second side 15B of the second atomic layer material film 15 of the sensor device 10A of this embodiment. The second dielectric layer 18 has an electrical insulating property and functions to protect the second atomic layer material film 15.

From the viewpoint of protecting the channel layer 13, the second dielectric layer 18 used is preferably a dielectric material such as silicon dioxide, aluminum oxide or silicon nitride.

By using a material with high permittivity as the second dielectric layer 18 it is possible to amplify an external electric field to act on the channel layer 14. Examples of materials that can amplify external electric fields include silicon dioxide, silicon nitride, zirconium dioxide and hafnium dioxide.

The second dielectric layer 18 preferably has higher permittivity than the second atomic layer material film 15 from the viewpoint of amplification of an external electric field. The charge Q stored in the second dielectric layer 18 is represented by $Q=\varepsilon_r SE$. The term $\varepsilon_r$ is the relative permittivity of the second dielectric layer 18, S is the area of the second dielectric layer 18, and E is the electric field strength of the external electric field.

When the second dielectric layer 18 having a higher permittivity than the second atomic layer material film 15 is disposed on the second atomic layer material film 15, it is possible to amplify the external electric field to act on the channel layer 14.

The relative permittivity of boron nitride, as a material forming the second atomic layer material film 15, is 3.4. From the viewpoint of amplification of an external electric field, the material forming the second dielectric layer 18 is most preferably silicon nitride (relative permittivity: 8.5), zirconium dioxide (relative permittivity: 32) or hafnium oxide (relative permittivity: 16 to 19).

The second dielectric layer 18 has a first side 18A and a second side 18B, the first side 18A being disposed on the second atomic layer material film 15. The second side 18B is the side of the second dielectric layer 18 opposite from the second atomic layer material film 15 side. At least the portion of the second side 18B opposite from the channel region 141 is exposed to the outside. The second side 18B forms an input/output region 18C where the external electric field is input/output. This allows the external electric field to be input into the sensor device 10A through the input/output region 18C. The external electric field can also be output from the sensor device 10A through the input/output region 18C.

With the sensor device of this embodiment as described above it is possible to increase the measuring sensitivity for an external electric field by amplification of the external electric field via the second dielectric layer 18. The sensor device of this embodiment can also exhibit the same effects as the first embodiment.

Figure 7:
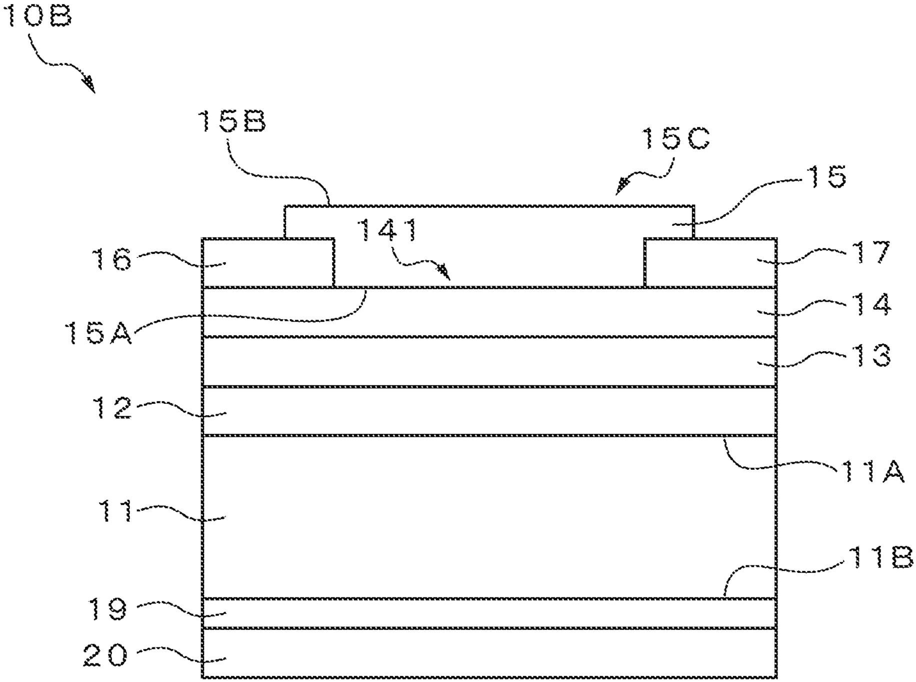
FIG. 7 is a cross-sectional view showing a third embodiment of the sensor device disclosed herein.

FIG. 7 is a cross-sectional view showing a third embodiment of the sensor device disclosed herein. The sensor device 10B of this embodiment is a "bottom-gate transistor".

The sensor device 10B of this embodiment has a gate insulating layer 19 disposed on the second side 11B of the substrate 11, with a gate electrode 20 disposed under the gate insulating layer 19. The gate electrode 20 is disposed on the second side 11B of the substrate 11 in a manner covering the region corresponding to the channel region 141.

The gate insulating layer 19 used may be a dielectric material such as silicon dioxide, aluminum oxide or silicon nitride.

The gate electrode 20 is formed of an electroconductive material, and may have a layered structure of chromium and gold, for example.

The sensor device 10B measures an external electric field while a predetermined voltage is being applied to the gate electrode 20. Application of the gate voltage to the gate electrode 20 causes the drain current to increase with respect to the level before application. Similar to the first embodiment described above, the sensor device 10B is able to measure the strength of an external electric field based on the degree of change in the drain current value with respect to the drain current value without application of the external electric field to the sensor device 10B.

The sensor device of this embodiment can also exhibit the same effects as the first embodiment.

Preferred embodiments of the method for producing the sensor device of the first embodiment will now be described while referring to FIG. 8 to FIG. 10.

Figure 8A:
FIG. 8 (A) to FIG. 8 (C) are diagrams illustrating the production steps for one embodiment of the method for producing the sensor device disclosed herein (1).

A substrate 11 with a first side 11A and a second side 11B is first prepared, as shown in FIG. 8(A). The substrate 11 may be a semiconductor substrate such as a silicon, silicon carbide or compound semiconductor substrate.

Figure 8B:
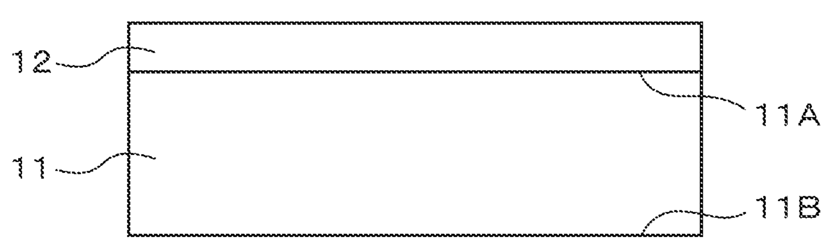

Next, as shown in FIG. 8(B), a dielectric layer 12 is formed on the first side 11A of the substrate 11. When a silicon substrate is used as the substrate 11, a silicon dioxide layer, for example, is formed as the dielectric layer 12. The silicon dioxide layer is formed using a thermal oxidation or CVD method. When a silicon dioxide layer is formed as the dielectric layer 12 using thermal oxidation, the interface between the silicon dioxide layer and silicon constitutes a new first side 11A.

Figure 8C:
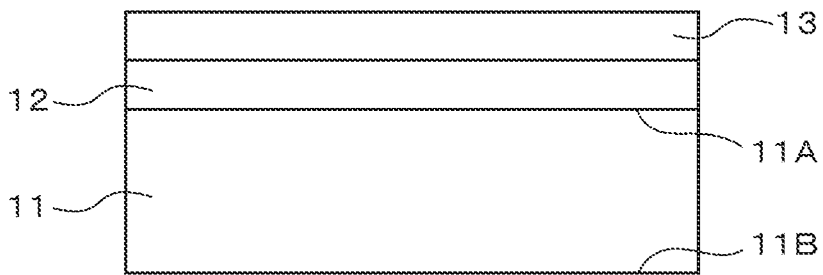

A first atomic layer material film 13 is disposed on the dielectric layer 12, as shown in FIG. 8(C). The first atomic layer material film 13 is formed by an exfoliation method or CVD method, for example, being thus transferred onto the dielectric layer 12. The thickness of the first atomic layer material film 13 is preferably in the range of 1 to 120 atomic layers.

Figure 9A:
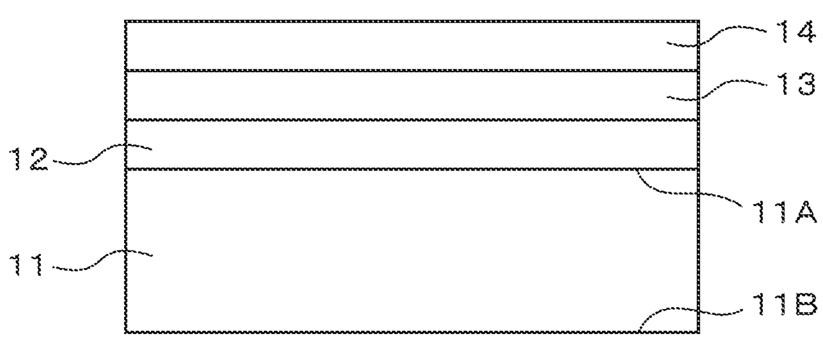
FIG. 9 (A) to FIG. 9 (B) are diagrams illustrating the production steps for one embodiment of the method for producing the sensor device disclosed herein (2).

A channel layer 14 is then formed on the first atomic layer material film 13, as shown in FIG. 9(A). The channel layer 14 is formed by an exfoliation method or CVD method, for example, being thus transferred onto the first atomic layer material film 13. The thickness and quality of the channel layer 14 is measured using Raman spectroscopy, for example. For instance, the presence or absence of defects in the graphene forming the channel layer 14 is measured by the D peak intensity at 1350 $cm^{-1}$, and the number of graphene atomic layers is measured by the G peak intensity at 1580 $cm^{-1}$ or the 2D peak shape at 2608 $cm^{-1}$. The channel layer 14 most preferably is formed by an exfoliation method from the viewpoint of obtaining high-quality graphene with few defects. A monoatomic layer channel layer 14 is preferably formed from the viewpoint of obtaining graphene with high carrier mobility. Impurities may also be added into the graphene to impart polarity to the channel layer 14.

Figure 9B:
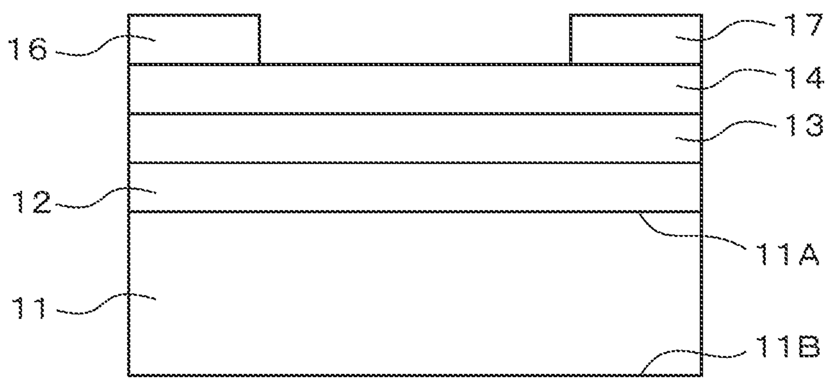

Next, as shown in FIG. 9(B), lithography and etching methods are used to form a mask (not shown) on the channel layer 14, after which an electric conductor layer is formed on the mask-formed channel layer 14, and the electric conductor layer (not shown) is patterned by a lift-off process to form a source electrode 16 and drain electrode 17 on the channel layer 14. The lithography method used may be electron-beam lithography, for example. The etching method used may be dry etching with oxygen plasma, for example. The electric conductor layer can be formed as a layered body of chromium and gold using electron beam evaporation, for example. The chromium thickness may be 5 nm and the gold thickness may be 80 nm.

Figures 10A, 10B:
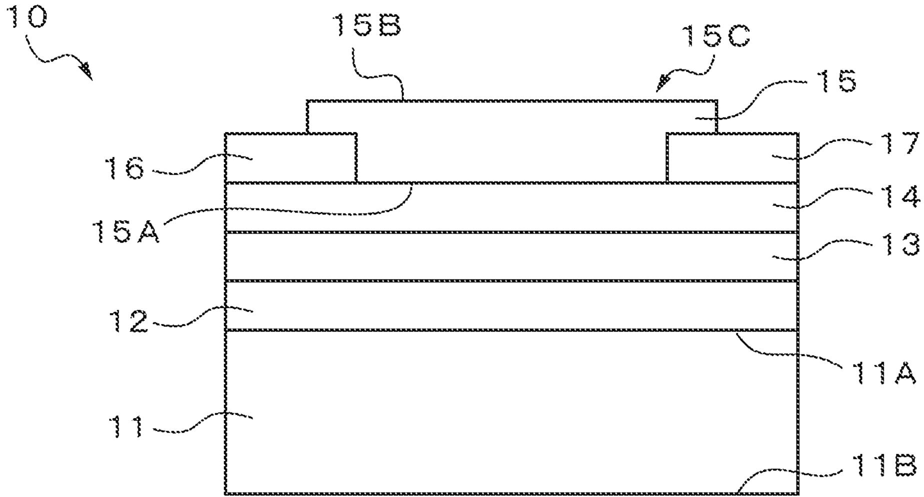
FIG. 10 (A) to FIG. 10 (B) are diagrams illustrating the production steps for one embodiment of the method for producing the sensor device disclosed herein (3).

A second atomic layer material film 15 is then formed on the channel layer 14, source electrode 16 and drain electrode 17, as shown in FIG. 10(A). The thickness of the second atomic layer material film 15 is preferably in the range of 1 to 300 atomic layers. The second atomic layer material film 15 is formed on the channel layer 14, source electrode 16 and drain electrode 17 using an exfoliation method or CVD method, for example. The explanation for the first atomic layer material film 13 provided above applies as relevant for formation of the second atomic layer material film 15 as well.

Next, as shown in FIG. 10(B), the second atomic layer material film 15 is patterned by lithography and etching methods to obtain a sensor device 10 according to the first embodiment shown in FIG. 1. The second atomic layer material film 15 is formed so as to cover at least part of the source electrode 16 and drain electrode 17. The lithography method used may be electron-beam lithography, for example. The etching method used may be dry etching with oxygen plasma, for example.

Following the step illustrated in FIG. 10(B), the second dielectric layer 18 is formed on the second side 15B of the second atomic layer material film 15, thereby producing a sensor device 10A for the second embodiment shown in FIG. 6.

Then, following the step illustrated in FIG. 10(B), a gate insulating layer 19 is formed on the second side 11B of the substrate 11 and a gate electrode 20 is formed over the gate insulating layer 19, thereby producing a sensor device 10B for the second embodiment shown in FIG. 7.

Figure 11:
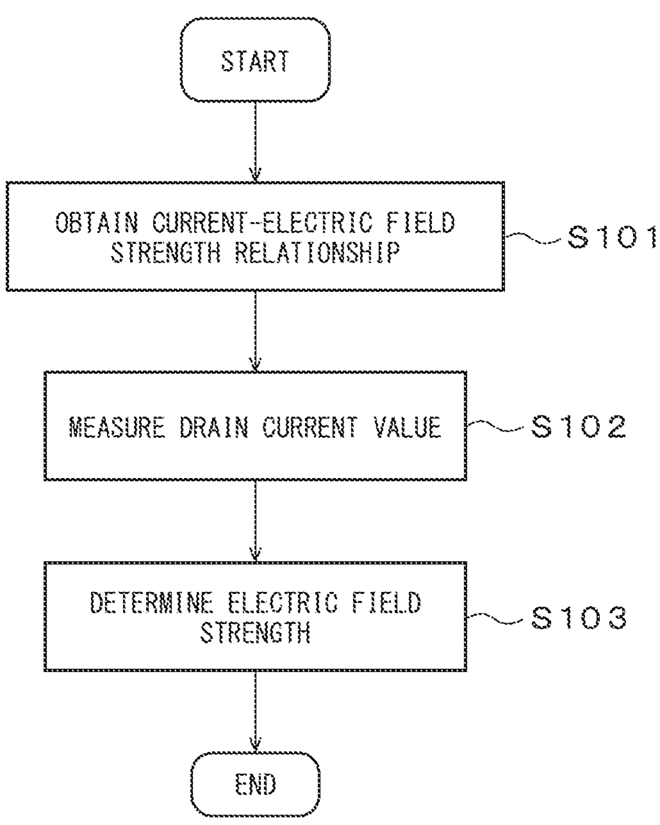
FIG. 11 is a flow chart for one embodiment of the method for measuring an external electric field disclosed herein.

A method for measuring an external electric field using the sensor device 10 of the first embodiment will now be explained with reference to FIG. 11. FIG. 11 is a flow chart for one embodiment of the method for measuring an external electric field disclosed herein.

First, the drain current value flowing between the source electrode 16 and drain electrode 17 is measured with application of external electric fields with multiple different electric field strengths (step S101). The relationship between drain current value and external electric field strength (current-electric field strength relationship) is thus ascertained.

Next, the drain current value flowing between the source electrode 16 and drain electrode 17 (measured drain current value) is measured while an external electric field to be measured is being applied to the sensor device 10. Preferably no voltage is applied to the substrate 11 in the sensor device 10 while the external electric field is being measured. Since the sensor device 10 has no electrodes other than the source electrode 16 and drain electrode 17, there is also no application of gate voltage to the sensor device 10 when the external electric field is being measured.

The electric field strength of the external electric field is then determined based on the measured drain current value (step S102). The external electric field to be measured is either input into the sensor device 10 through the input/output region 15C, or is output from the sensor device 10 through the input/output region 15C. The current-electric field strength relationship is used as reference to determine the electric field strength corresponding to the measured drain current value, in order to obtain the electric field strength of the external electric field.

Incidentally, the processing in step S101 is omitted if the current-electric field strength relationship has been acquired beforehand.

The method for measuring an external electric field according to this embodiment allows measurement of small electric field strengths using this sensor device 10 which has small dimensions.

An external electric field can likewise be measured using the sensor device 10A of the second embodiment. The external electric field to be measured is either input into the sensor device 10A through the input/output region 18C, or it is output from the sensor device 10A through the input/output region 18C. An external electric field can likewise be measured using the sensor device 10B of the third embodiment. The external electric field to be measured is either input into the sensor device 10B through the input/output region 15C, or it is output from the sensor device 10B through the input/output region 15C.

The electric field strength-measuring sensor device and the method for measuring external electric fields according to the embodiments described above may be appropriately modified within the scope of the gist of the present disclosure. The constituent features of any of the embodiments may also be applied as appropriate to the other embodiments.

REFERENCE SIGNS LIST

10 Sensor device
11 Substrate
11A First side
11B Second side
12 Dielectric layer (first dielectric layer)
13 First atomic layer material film
14 Channel layer
141 Channel region
15 Second atomic layer material film
15A First side
15B Second side
16 Source electrode (first electrode)
17 Drain electrode (second electrode)
18 Second dielectric layer
19 Gate insulating layer
20 Gate electrode (third electrode)

The invention claimed is:

1. A sensor device capable of measuring electric field strength of an external electric field, and the sensor device comprises:

a first dielectric layer;

a first atomic layer material film disposed on the first dielectric layer and including one or more atomic layers formed of a first material;

a channel layer disposed on the first atomic layer material film, including a channel region, and including one or more atomic layers of graphene;

a second atomic layer material film disposed on the channel layer and including one or more atomic layers formed of a second material; and a first electrode and second electrode disposed on the channel layer across the channel region in a manner facing each other, wherein the second atomic layer material film includes a first side and a second side, the first side being disposed on the channel layer and a second dielectric layer being disposed above the second side and the portion on the side opposite from the channel region of the side of the second dielectric layer opposite from the second atomic layer material film being exposed to the outside.

2. The sensor device according to claim 1, wherein the first atomic layer material film includes 1 to 120 atomic layers formed of the first material.

3. The sensor device according to claim 1, wherein the second atomic layer material film includes 1 to 100 atomic layers formed of the second material.

4. The sensor device according to claim 1, wherein the first material or the second material is hexagonal boron nitride, molybdenum disulfide or tungsten disulfide.

5. The sensor device according to claim 1, wherein the channel layer includes 1 to 10 layers of graphene.

6. A method for measuring an external electric field using a sensor device capable of measuring electric field strength of an external electric field, and the sensor device comprises:

a first dielectric layer;

a first atomic layer material film disposed on the first dielectric layer and including one or more atomic layers formed of a first material;

a channel layer disposed on the first atomic layer material film, including a channel region, and including one or more atomic layers of graphene;

a second atomic layer material film disposed on the channel layer and including one or more atomic layers formed of a second material; and a first electrode and second electrode disposed on the channel layer across the channel region in a manner facing each other, wherein the second atomic layer material film includes a first side and a second side, the first side being disposed on the channel layer and a second dielectric layer being disposed above the second side and the portion on the side opposite from the channel region of the side of the second dielectric layer opposite from the second atomic layer material film being exposed to the outside, the method comprising:

measuring a current value flowing between the first electrode and second electrode while the external electric field is being applied to the sensor device; and determining electric field strength of the external electric field based on the current value.

7. The method according to claim 6, wherein the electric field strength is measured for an external electric field input from the side of the second dielectric layer opposite from the second atomic layer material film, or output from the side of the second dielectric layer opposite from the second atomic layer material film.

* * * * *